(12) United States Patent
Shin et al.

(10) Patent No.: US 8,404,543 B2
(45) Date of Patent: Mar. 26, 2013

(54) METHOD FOR FABRICATING SEMICONDUCTOR DEVICE WITH BURIED GATE

(75) Inventors: Jong-Han Shin, Gyeonggi-do (KR);
Cheol-Hwi Ryu, Gyeonggi-do (KR);
Sung-Jun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 586 days.

(21) Appl. No.: 12/623,719

(22) Filed: Nov. 23, 2009

(65) Prior Publication Data

US 2010/0330775 A1    Dec. 30, 2010

(30) Foreign Application Priority Data

Jun. 30, 2009  (KR) .................. 10-2009-0059382

(51) Int. Cl.
*H01L 21/336* (2006.01)
(52) U.S. Cl. ..................................... 438/270
(58) Field of Classification Search .......... 438/270, 438/272, 279
See application file for complete search history.

(56) References Cited

U.S. PATENT DOCUMENTS

| 7,867,851 B2 * | 1/2011 | Hanson et al. ............. 438/268 |
| 2010/0258858 A1 * | 10/2010 | Kim ............................. 257/330 |
| 2011/0003459 A1 * | 1/2011 | Shin et al. .................... 438/430 |

FOREIGN PATENT DOCUMENTS

| JP | 2001-189456 | 7/2001 |
| KR | 1020040002411 | 1/2004 |
| KR | 1020060093165 | 8/2006 |
| KR | 1020070007451 | 1/2007 |

OTHER PUBLICATIONS

Notice of Allowance issued by the Korean Intellectual Property Office on Nov. 28, 2011.
Notice of Preliminary Rejection issued from Korean Intellectual Property Office on Mar. 9, 2011.

* cited by examiner

*Primary Examiner* — Bradley K Smith
(74) *Attorney, Agent, or Firm* — IP & T Group LLP

(57) ABSTRACT

A method for fabricating a semiconductor device with a buried gate includes: etching a substrate to form a plurality of trenches; forming a plurality of buried gates that fill lower portions of the trenches; forming a plurality of sealing layers that gap-fill upper portions of the trenches and have protrusions higher than a top surface of the substrate; forming an inter-layer insulation layer over the whole surface of the substrate including the sealing layers; and etching the inter-layer insulation layer to form a contact hole that is aligned with a space between the protrusions of the sealing layers.

26 Claims, 8 Drawing Sheets

METHOD FOR FABRICATING SEMICONDUCTOR DEVICE WITH BURIED GATE

CROSS-REFERENCE TO RELATED APPLICATIONS

The present application claims priority of Korean Patent Application No. 10-2009-0059382, filed on Jun. 30, 2009, which is incorporated herein by reference in its entirety.

BACKGROUND OF THE INVENTION

An exemplary embodiment of the present invention relates to a method for fabricating a semiconductor device, and more particularly, to a method for fabricating a semiconductor device including a buried gate.

In a fabricating process for a small DRAM, such as a 60 nm DRAM, it is helpful to form a buried word line in order to increase the degree of integration of transistors in a cell, simplify a fabricating process, and improve a device property such as current leakage property.

In general, a trench is formed and a word line is buried in the trench to form a buried word line. This buried word line forming method, according to the related art, has the following advantages. The interference between a bit line and a word line is minimized, the number of stacked films is reduced, and a refresh property is improved by reducing overall capacitance of cells.

FIG. 1 is a cross-sectional view illustrating a semiconductor device employing a conventional buried gate.

Referring to FIG. 1, the conventional semiconductor device includes a semiconductor substrate 11 where an active region 13 is defined by a device isolation layer 12, a trench 14 formed by simultaneously etching the active region 13 and the device isolation layer 12, a buried gate 16 filling a part of the trench 14, and a gap-fill layer 17 formed on the buried gate 16 to gap-fill the rest of the trench 14. A gate dielectric layer 15 is formed between the buried gate 16 and the trench 14.

In the prior art illustrated in FIG. 1, the gap-fill layer 17 gap-fills on the upper side of the buried gate 16 to prevent the buried gate 16 from being oxidized and degraded in a subsequent heating process. In the prior art illustrated in FIG. 1, the gap-fill layer 17 uses a silicon oxide layer, and the buried gate 16 uses a metal gate.

However, since a subsequent stacked layer is formed after forming the buried gate 16, the buried gate 16 may be degraded during a subsequent heating process, such as an oxidation process.

Further, a contact hole 19 is formed by etching an inter-layer dielectric layer 18 in a state that no structure is formed after forming the stacked layer of the buried gate 16 and the gap-fill layer 17. As a result, it is difficult to secure a process margin for forming a contact. Since the contact hole 19 is formed through the gap-fill layer 17 when an overlay is missed (see the reference numeral '20') a short between the buried gate 16 and the contact can occur.

SUMMARY OF THE INVENTION

An exemplary embodiment of the present invention is directed to providing a method for fabricating a semiconductor device with a buried gate, capable of securing a process margin for forming a contact, and preventing a short between a buried gate and a contact from being occurred even if an overlay is missed.

In accordance with an aspect of the present invention, a method for fabricating a semiconductor device includes: etching a substrate to form a plurality of trenches; forming a plurality of buried gates that fill lower portions of the trenches; forming a plurality of sealing layers that gap-fill upper portions of the trenches and have protrusions higher than a top surface of the substrate; forming an inter-layer insulation layer over the whole surface of the substrate including the sealing layers; and etching the inter-layer insulation layer to form a contact hole that is aligned with a space between the protrusions of the sealing layers.

In accordance with another aspect of the present invention, a method for fabricating a semiconductor device includes: etching a substrate to form a plurality of trenches; forming a plurality of buried gates that fill lower portions of the trenches; forming a plurality of first sealing layers that gap-fill upper portions of the trenches and have protrusions higher than a top surface of the substrate; forming a second sealing layer along a profile of the whole surface of the substrate including the first sealing layers; forming an inter-layer insulation layer over the second sealing layer; and etching the inter-layer insulation layer to form a contact hole that is aligned with a space between the protrusions of the first sealing layers.

In accordance with another aspect of the present invention, a method for fabricating a semiconductor device includes: forming a hard mask pattern over a substrate, wherein the hard mask pattern is a stacked layer of first to third hard mask layers; forming a plurality of trenches by etching the substrate using the hard mask pattern as an etch barrier; forming a plurality of buried gates that fill lower portions of the trenches; forming a sealing layer over the whole surface of the substrate to gap-fill upper portions of the trenches; forming a plurality of sealing layer patterns that are isolated by etching the sealing layer until the second hard mask layer is exposed; forming a plurality of protrusions of the sealing layer patterns by removing the second hard mask layer; forming an inter-layer insulation layer over the whole surface of the substrate including the sealing layer patterns; and etching the inter-layer insulation layer to form a contact hole that is aligned with a space between the protrusions of the sealing layer patterns.

In accordance with another aspect of the present invention, a method for fabricating a semiconductor device includes: forming a hard mask pattern over a substrate, wherein the hard mask pattern is a stacked layer of first to third hard mask layers; forming a plurality of trenches by etching the substrate using the hard mask pattern as an etch barrier; forming a plurality of buried gates that fill lower portions of the trenches; forming a first sealing layer over the whole surface of the substrate to gap-fill upper portions of the trenches; forming a plurality of first sealing layer patterns that are isolated by etching the first sealing layer until the second hard mask layer is exposed; forming a plurality of protrusions of the first sealing layer patterns by removing the second hard mask layer; forming a second sealing layer along with a profile of the whole surface of the substrate including the first sealing layer patterns; forming an inter-layer insulation layer over the second sealing layer; and etching the inter-layer insulation layer to form a contact hole that is aligned with a space between the protrusions of the first sealing layer patterns.

DESCRIPTION OF SPECIFIC EMBODIMENTS

Figure 1:
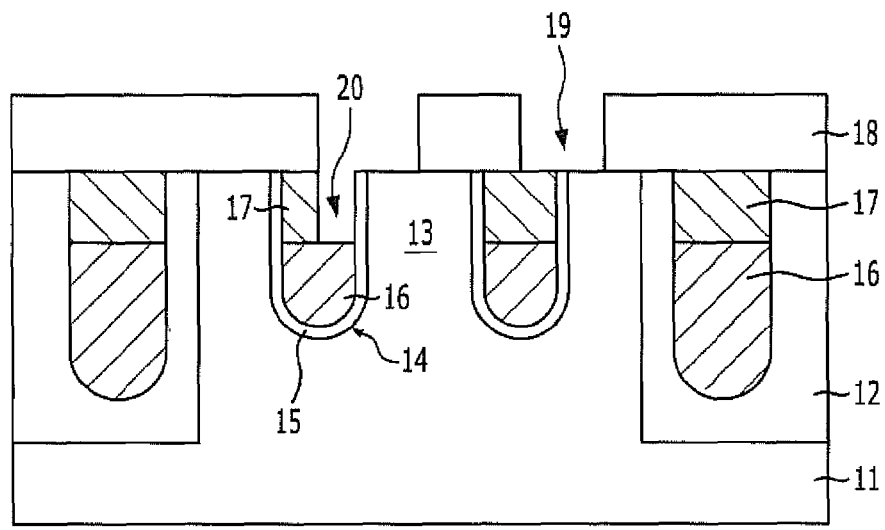
FIG. 1 is a cross-sectional view illustrating a semiconductor device employing a conventional buried gate.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on, and/or over, the second layer or the substrate, or it could also mean that a third layer may exist between the first layer and the second layer or the substrate. Furthermore, the same or like reference numerals represent the same or like constituent elements, although they appear in different embodiments or drawings of the present application.

FIGS. 2A to 2J are cross-sectional views illustrating a method for fabricating a semiconductor device employing a buried gate in accordance with a first embodiment of the present invention.

Figure 2A:
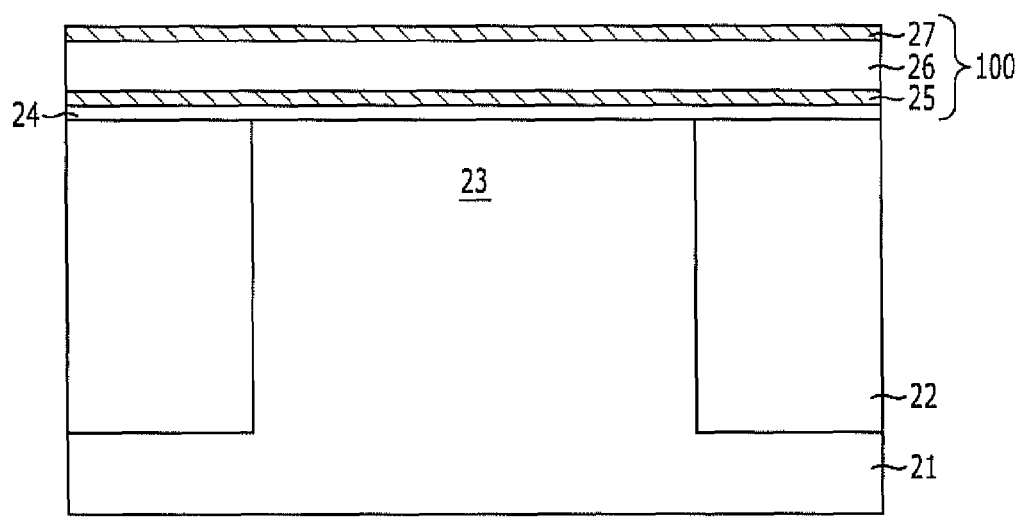
FIGS. 2A to 2J are cross-sectional views illustrating a method for fabricating a semiconductor device employing a buried gate in accordance with a first embodiment of the present invention.

Referring to FIG. 2A, a device isolation layer 22 is formed over a semiconductor substrate 21 through a shallow trench isolation (STI) process. The semiconductor substrate 21 may include a silicon substrate, and the device isolation layer 22 may include an oxide layer such as a high-density plasma (HDP) oxide layer and a spin-on dielectric (SOD) layer which includes a silicon oxide layer made from a PolySilaZane (PSZ). Here, an active region 23 is defined by the device isolation layer 22.

A pad layer 24 and a hard mask layer 100 are sequentially formed thereon. The pad layer 24 may include an oxide layer, and the hard mask layer 100 includes a multi-layer structure, e.g., a stacked layer of first to third hard masks. The hard mask layer 100 may have a nitride-oxide-nitride (NON) structure which is formed by sequentially stacking a first nitride layer 25, an oxide layer 26, and a second nitride layer 27. The oxide layer 26 of the hard mask layer 100 may have a thickness greater than the first and second nitride layers 25 and 27, and the second nitride layer 27 may have a thickness greater than the first nitride layer 25.

Figure 2B:
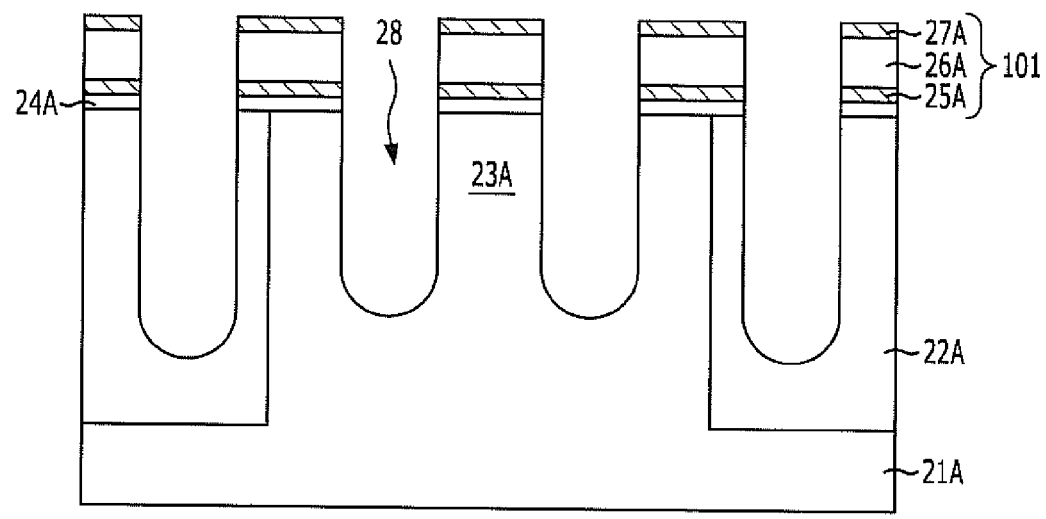

Referring to FIG. 2B, a hard mask pattern 101 is formed by etching the hard mask layer using a trench mask (not shown), and a plurality of trenches 28 where a buried gate is to be formed are formed through an etching process using the hard mask pattern 101 as an etch barrier. At this time, the trenches 28 are formed by etching the device isolation layer as well as the active region. Hereinafter, the etched substrate is referred to as "a substrate 21A", the etched device isolation layer is referred to as "a device isolation layer 22A", the etched active region is referred to as "an active region 23A", the etched pad layer is referred to as "a pad layer pattern 24A", the etched first nitride layer is referred to as "a first nitride layer pattern 25A", the etched oxide layer is referred to as "an oxide layer pattern 26A", and the etched second nitride layer is referred to as "a second nitride layer pattern 27A".

In general, since a gate is a line type, each trench 28 is also a line type. Therefore, each trench 28 is formed to be the line type that crosses the active region 23A as well as the device isolation layer 22A. However, since an etch selectivity of the active region 23A is different from that of the device isolation layer 22A, a depth of each trench 28 in the device isolation layer 22A may be deeper than that in the active region 23A, as the device isolation layer 22A may be more prone to being etched than the active region 23A.

As described above, the etching process of forming the trenches 28 to be filled with the buried gate uses the hard mask pattern 101 as an etch barrier, wherein the pad layer is etched by using the hard mask pattern 101, and then the device isolation layer as well as the active region is sequentially etched.

Figure 2C:
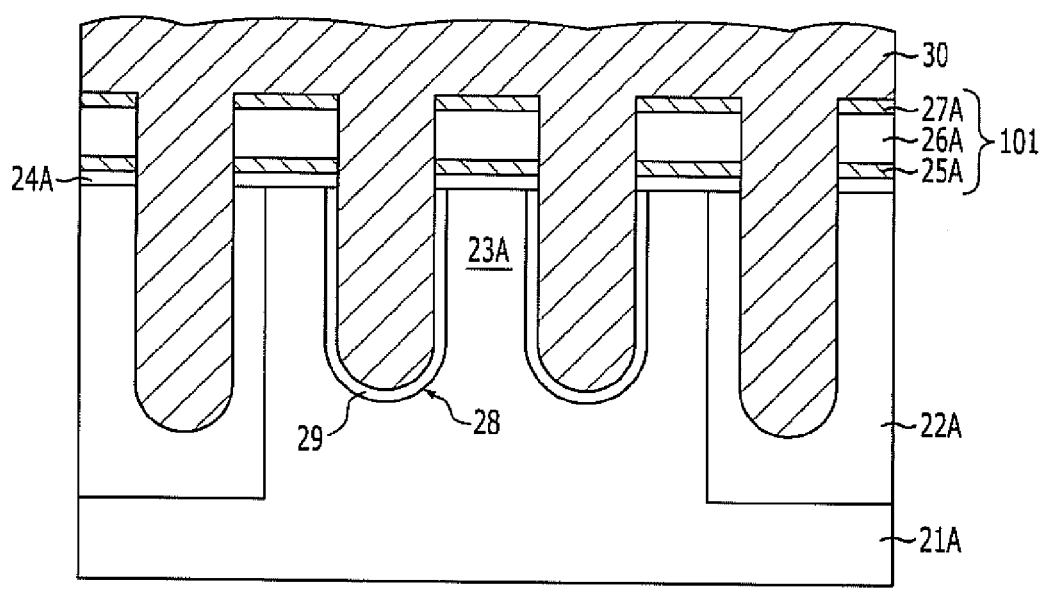

Referring to FIG. 2C, a gate dielectric layer 29 is formed on a sidewall and a bottom of the trenches 28 over the active region 23A through a gate oxidation process. The gate dielectric layer 29 may include a silicon oxide layer.

Subsequently, a metal layer 30 is formed over the gate dielectric layer 29 to cover an entire surface of the semiconductor substrate 21A and to gap-fill the trenches 28. The metal layer 30 to be used as a buried gate may include any one selected from a group comprising a TaN layer, a TiN layer, a tungsten (W) layer, and a combination thereof. For example, the metal layer 30 may include a sole layer selected from one of a TiN layer and a TaN layer, or a stacked layer formed by stacking a TiN layer and a W layer such as a TiN/W layer, or by stacking a TaN layer and a W layer such as a TaN/W layer.

Figure 2D:
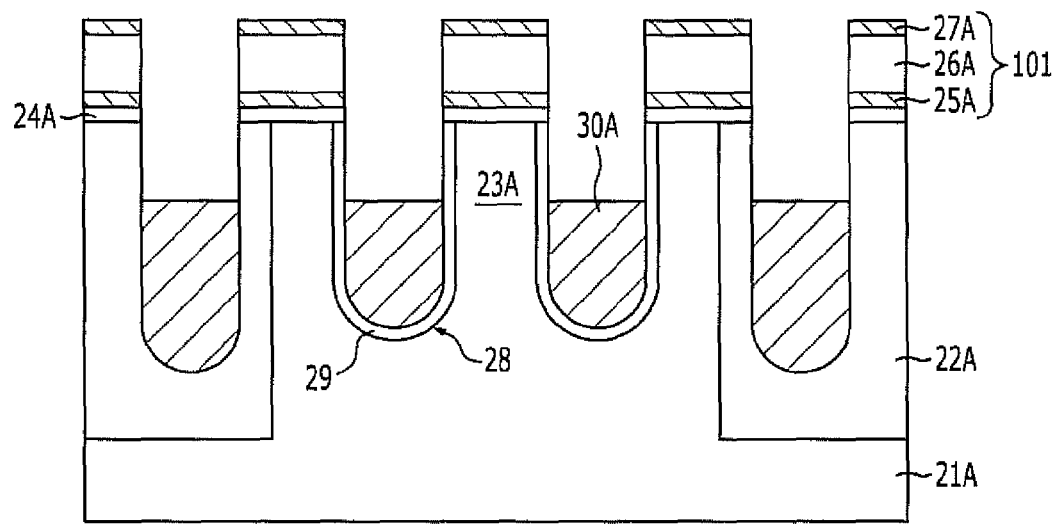

Referring to FIG. 2D, a planarization process such as a chemical mechanical polishing (CMP) process and an etch-back process are sequentially performed on the metal layer 30 to form a buried gate 30A to fill a part of each trench 28. At this time, the CMP process is performed on the metal layer 30 until the second nitride layer pattern 27A of the hard mask pattern 101 is exposed, and the etch-back process is performed until a desired height of the buried gate 30A remains.

The buried gate 30A has a structure to fill a lower part of inside the trenches 28 over the gate dielectric layer 29, wherein the buried gate 30A fills the lower part of inside the trenches 28 in the device isolation layer 22A as well as that in the active region 23A.

Figure 2E:
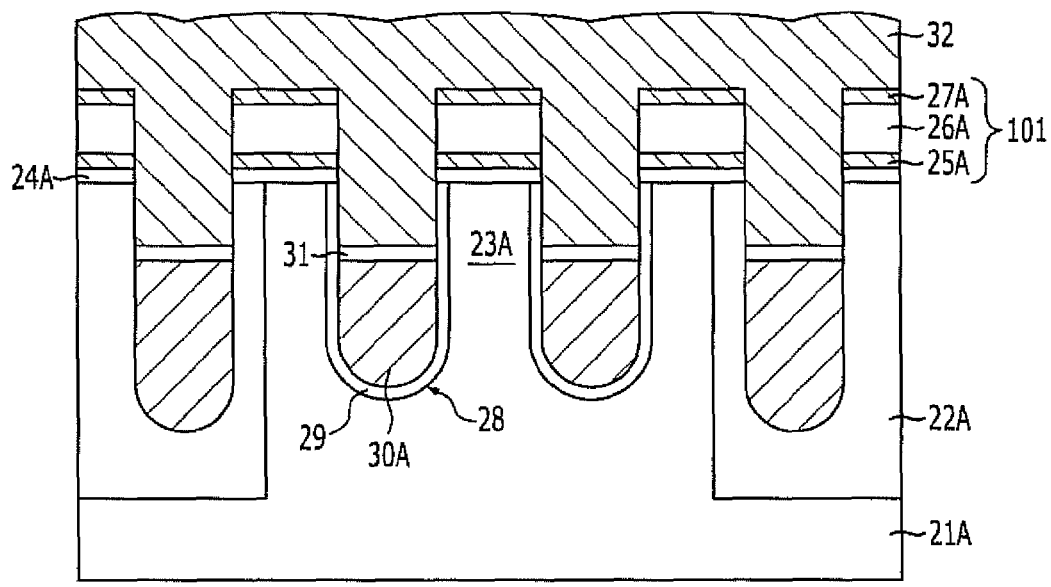

Referring to FIG. 2E, a sealing process is performed on the buried gate 30A. First, a top surface of the buried gate 30A is selectively oxidized to form a sealing oxide layer 31 thereon. Then, the sealing process is performed to seal the whole surface of the semiconductor substrate 21A using a sealing nitride layer 32. Here, the sealing oxide layer 31 is used as a passivation layer.

Figure 2F:
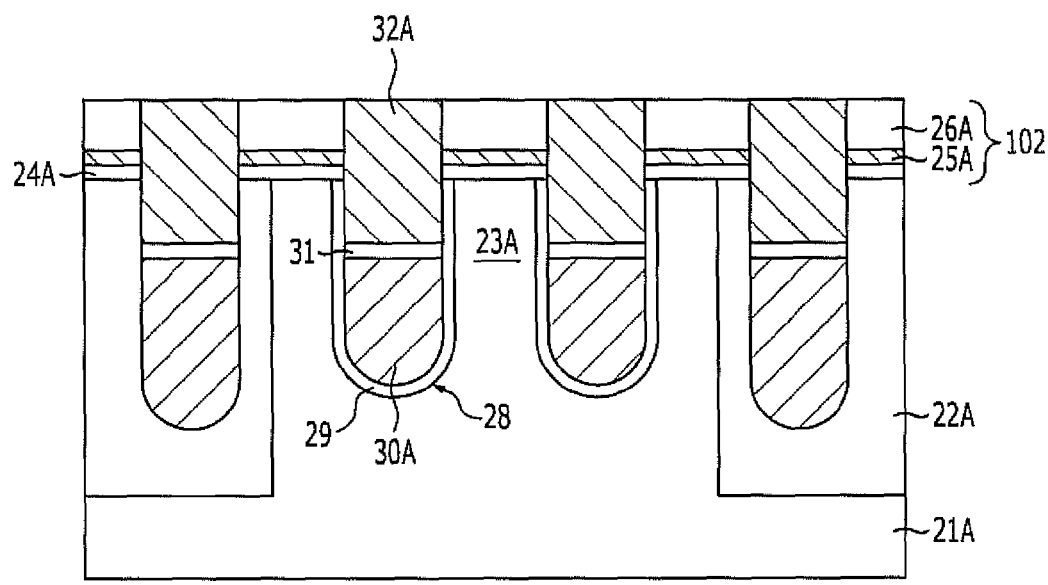

Referring to FIG. 2F, a CMP process is performed on the sealing nitride layer until the second nitride layer pattern of the hard mask pattern 101 is removed and the oxide layer pattern 26A of the hard mask pattern 101 is exposed. As a result, a sealing nitride layer pattern 32A is formed to be isolated between the trenches 28.

A slurry, including a reverse selective slurry, is used to stop the CMP process when the oxide layer pattern 26A is exposed. That is, since a polish selectivity of a nitride layer may be different from that of an oxide layer, it is possible to selectively remove the second nitride layer pattern 27A and the sealing nitride layer 32 by using the reverse selective slurry.

After finishing the CMP process, the sealing nitride layer pattern 32A remains over the buried gate 30A only, and the sealing oxide layer 31 is disposed between the sealing nitride layer pattern 32A and the buried gate 30A. Further, a hard mask pattern 102 including a stacked layer of the oxide layer pattern 26A and the first nitride layer pattern 25A remains.

Figure 2G:
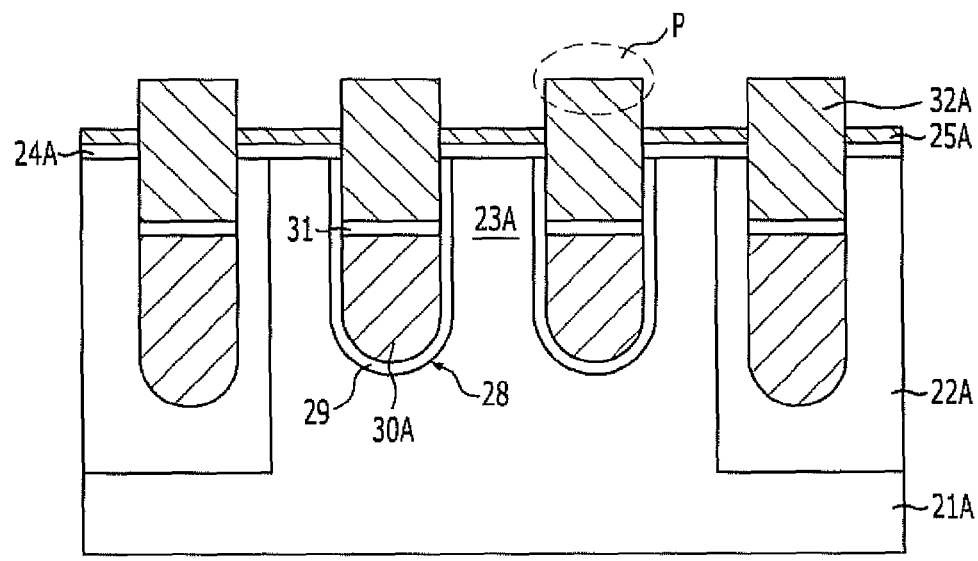

Referring to FIG. 2G, the oxide layer pattern 26A of the hard mask pattern 102 is removed through a dip-out process.

As a result, the oxide layer pattern 26A is removed, and only the first nitride layer pattern 25A may remain.

As described above, after removing the oxide layer pattern 26A, the sealing nitride layer pattern 32A has a protrusion P. The protrusion P of the sealing nitride layer pattern 32A acts as a support for self-alignment during a subsequent contact process.

Figure 2H:
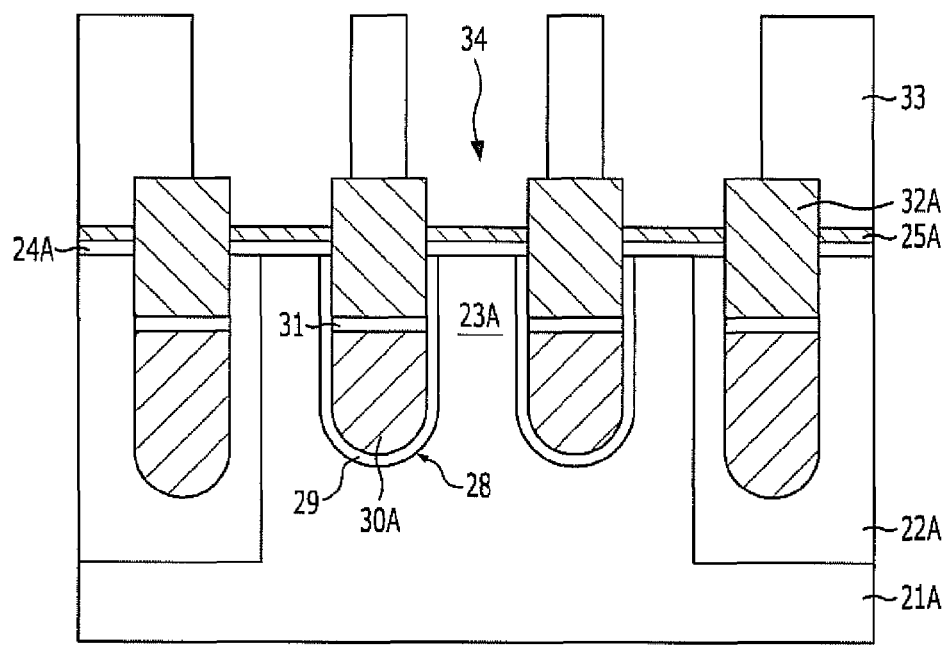

Referring to FIG. 2H, after forming an inter-layer insulation layer 33, a contact hole 34 is formed by etching the inter-layer insulation layer 33. Although not shown, a gate oxidation process and a gate process for transistors in a peripheral circuit region may be performed before forming the inter-layer insulation layer 33. Meanwhile, the gate oxidation process in a peripheral circuit region may simultaneously proceed with a process for forming a pad layer; or the gate oxidation process may proceed after defining a peripheral circuit region and completely removing a sealing nitride layer after forming the buried gate.

The contact hole 34 may include a contact hole for a landing plug, a bit line contact hole, or a storage node contact hole. Furthermore, the storage node contact hole may be formed after forming a bit line through the bit line contact hole, or the bit line contact hole and the storage node contact hole may be simultaneously formed.

During the above-discussed process for forming the contact hole 34, the inter-layer insulation layer is etched until the sealing nitride layer pattern 32A is exposed, and then the contact hole 34 is self-aligned with a space between the protrusion P of the sealing nitride layer pattern 32A.

Figure 2I:
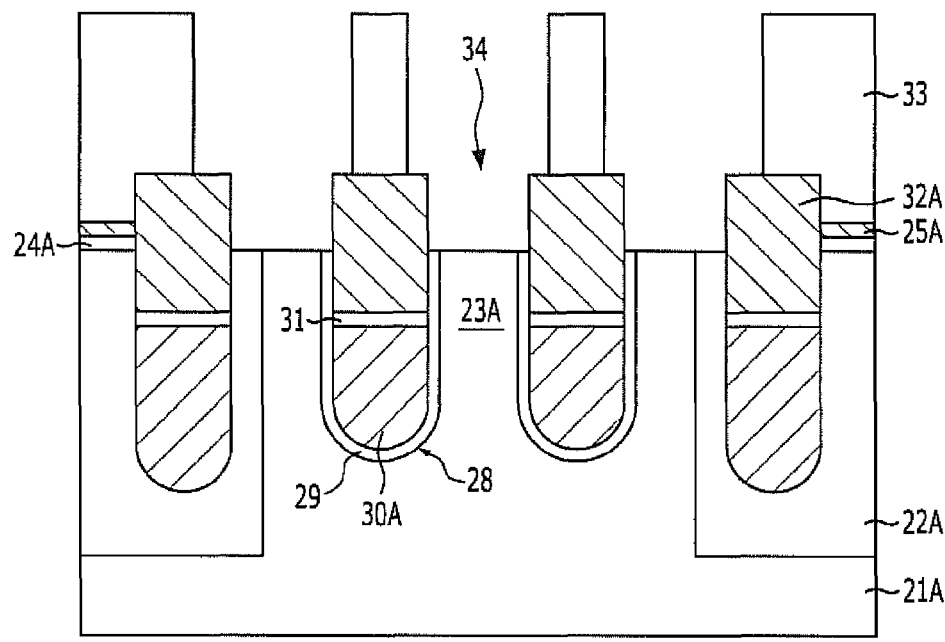

Referring to FIG. 2I, an over-etch process for a nitride layer is performed to thereby remove the oxide layer pattern 25A and the pad layer pattern 24A in the contact hole 34. Accordingly, the semiconductor substrate 21A below the contact hole 34 is exposed.

Figure 2J:
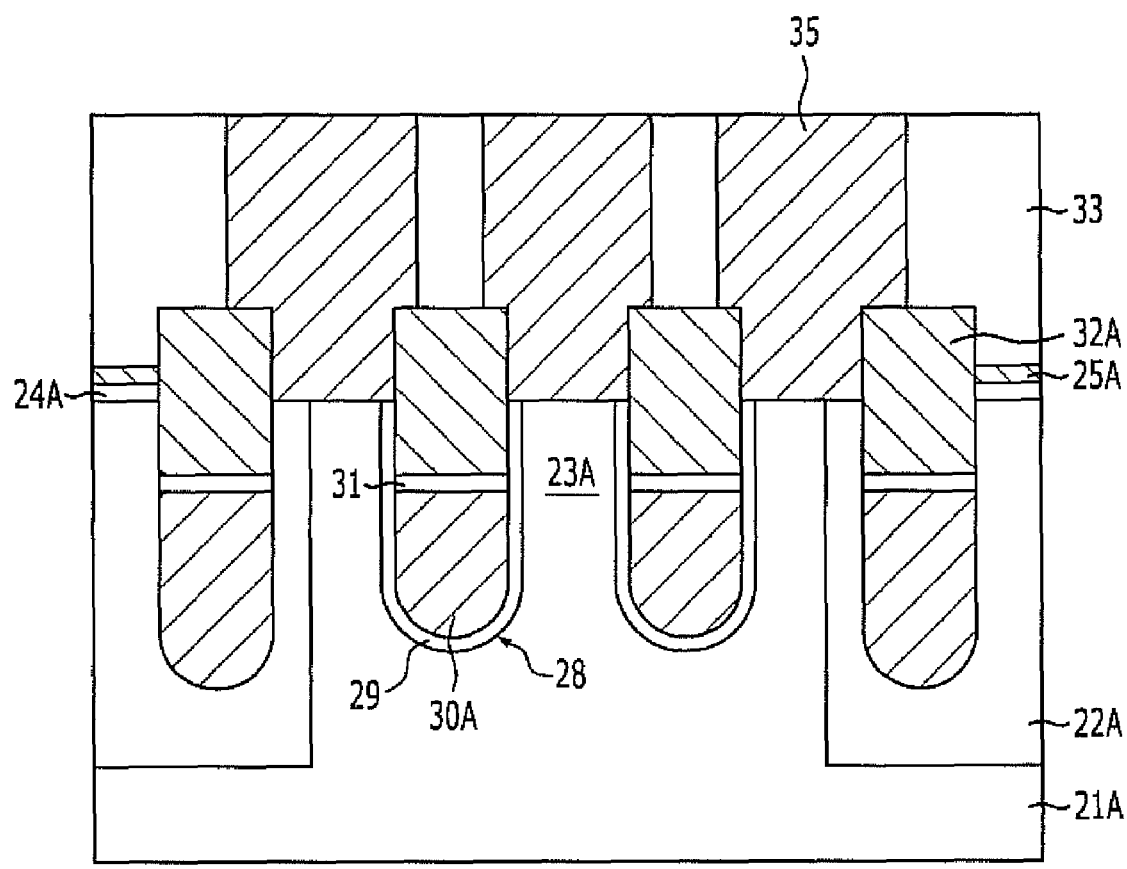

Referring to FIG. 2J, a contact plug 35 is formed in the contact hole 34. The contact plug 35 may include a metal layer, such as a tungsten (W) layer.

As described above, it is possible to reduce a distribution of resistances between the contact plugs 35 by uniformly maintaining a width of a region where the contact hole is formed, and prevent a short between the buried gate 30A and the contact plug 35 from being generated. As a result, a contact can be stably formed.

FIGS. 3A to 3D are cross-sectional views illustrating a method for fabricating a semiconductor device employing a buried gate in accordance with a second embodiment of the present invention.

Hereinafter, a process before forming a protrusion P of a sealing nitride layer pattern refers to FIGS. 2A to 2G. In the second embodiment, for the convenience of explanation, the sealing nitride layer pattern 32A shown in FIGS. 2A to 2G is referred to as 'a first sealing nitride layer 32A'.

Figure 3A:
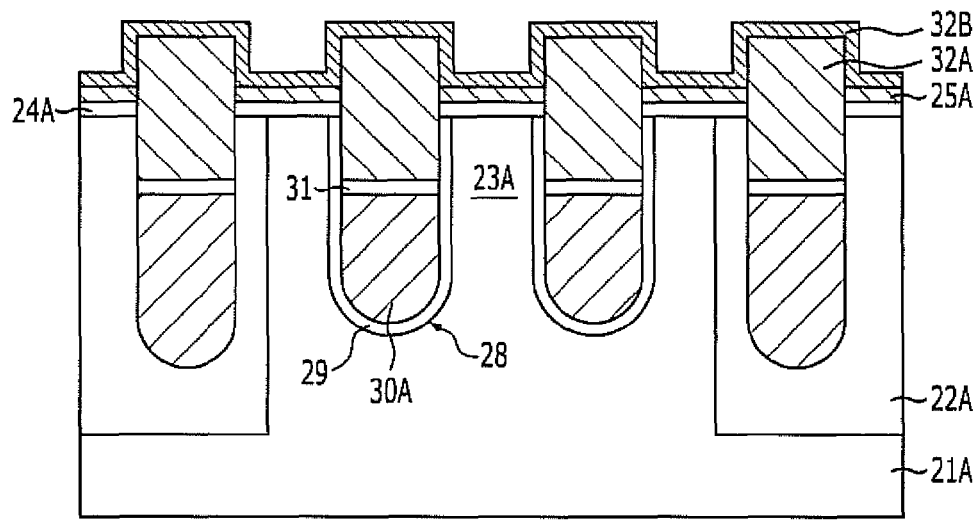
FIGS. 3A to 3D are cross-sectional views illustrating a method for fabricating a semiconductor device employing a buried gate in accordance with a second embodiment of the present invention.

Referring to FIG. 3A, a second sealing nitride layer 32B is shallowly formed over the entire surface of a resultant structure including the protrusion P of the first sealing nitride layer 32A described in FIG. 2G. The second sealing nitride layer 32B has a thickness less than approximately 100 Å, where the buried gate 30A is sealed using a double sealing layer including the first sealing nitride layer 32A and the second sealing nitride layer 32B.

Figure 3B:
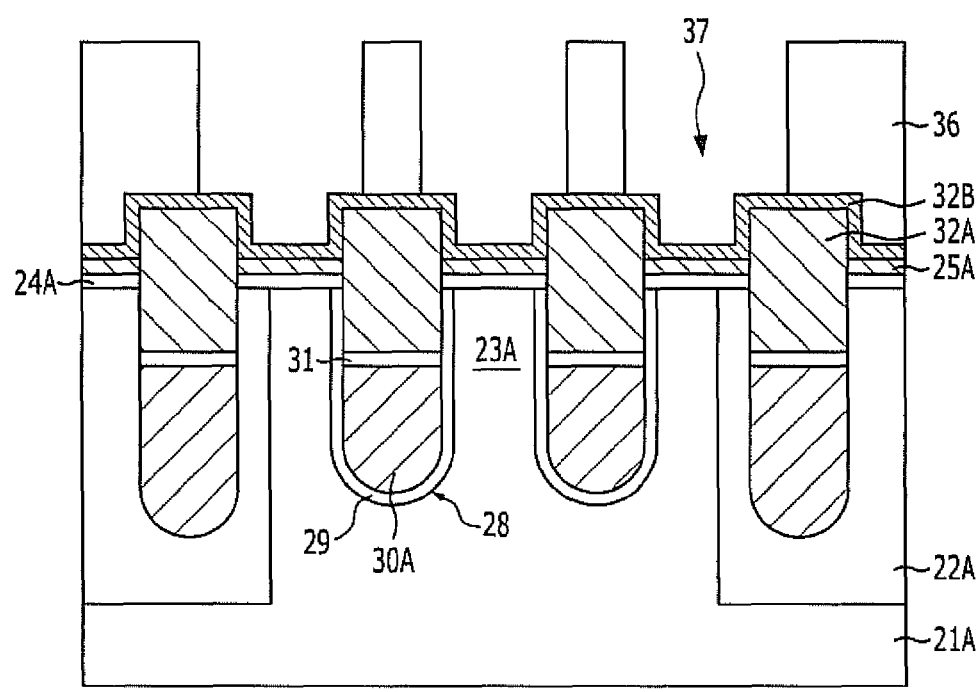

Referring to FIG. 3B, after forming an inter-layer insulation layer 36, a contact hole 37 is formed by etching the inter-layer insulation layer 36. Although not shown, a gate oxidation process and a gate process for transistors in a peripheral circuit region may be performed before forming the inter-layer insulation layer 36. Meanwhile, the gate oxidation process in a peripheral circuit region may simultaneously proceed with a process for forming a pad layer; or the gate oxidation process may proceed after defining a peripheral circuit region and completely removing a sealing nitride layer after forming the buried gate.

The contact hole 37 includes a contact hole for a landing plug, a bit line contact hole, or a storage node contact hole. Furthermore, the storage node contact hole may be formed after forming a bit line through the bit line contact hole, or the bit line contact hole and the storage node contact hole may be simultaneously formed.

During the above-described process for forming the contact hole 37, the inter-layer insulation layer is formed over the whole surface of the substrate and then the inter-layer insulation layer is etched until the second sealing nitride layer pattern 32B is exposed, and then the contact hole 37 is self-aligned with a space between the protrusion P of the second sealing nitride layer 32B.

Figure 3C:
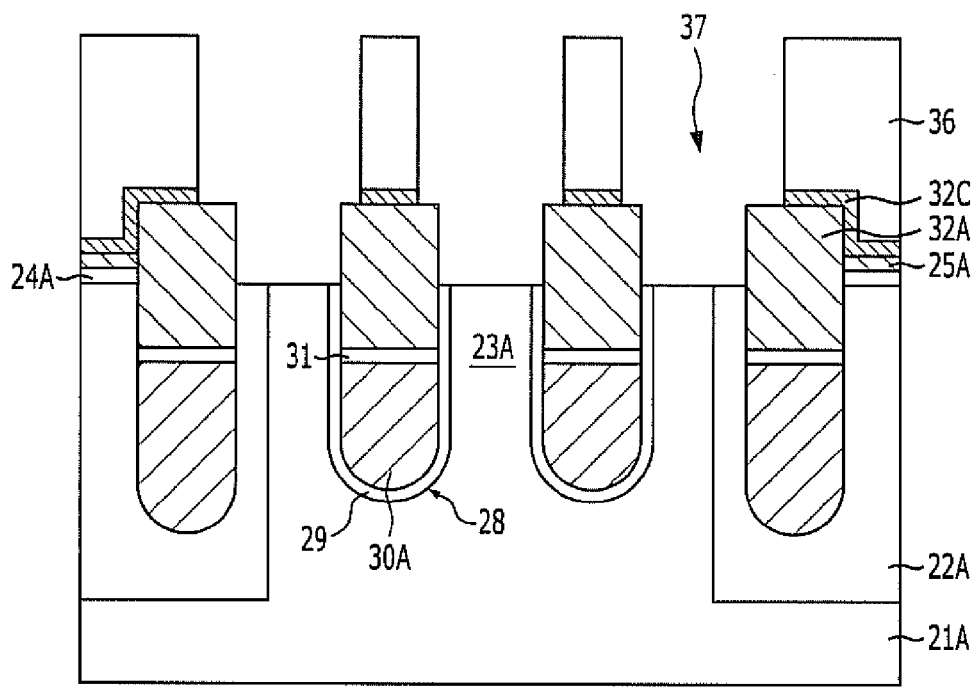

Referring to FIG. 3C, an over-etch process for a nitride layer is performed to thereby remove the second sealing nitride layer 32B, the oxide layer pattern 25A, and the pad layer pattern 24A in the contact hole 37. Accordingly, the second sealing nitride layer 32B is selectively removed to thereby form a second sealing nitride layer pattern 32C, and the semiconductor substrate 21A below the contact hole 37 is exposed.

When the over-etch process for the nitride layer is performed, the second sealing nitride layer 32B in the contact hole 37 prevents loss of sidewalls and corners of the first sealing nitride layer 32A. That is, in absence of the second sealing nitride layer 32B, the sidewalls and corners of the first sealing nitride layer 32A may be lost during the over-etch process for the nitride layer. However, by additionally sealing the second sealing nitride layer 32B, it is possible to prevent the loss of the sidewalls and corners of the first sealing nitride layer 32A. Accordingly, during the over-etch process for the nitride layer, it is possible to prevent the loss of the sidewalls and corners of the first sealing nitride layer 32A, even if the second sealing nitride layer 32B is lost. Thus, a stability of contacts may be achieved.

Figure 3D:
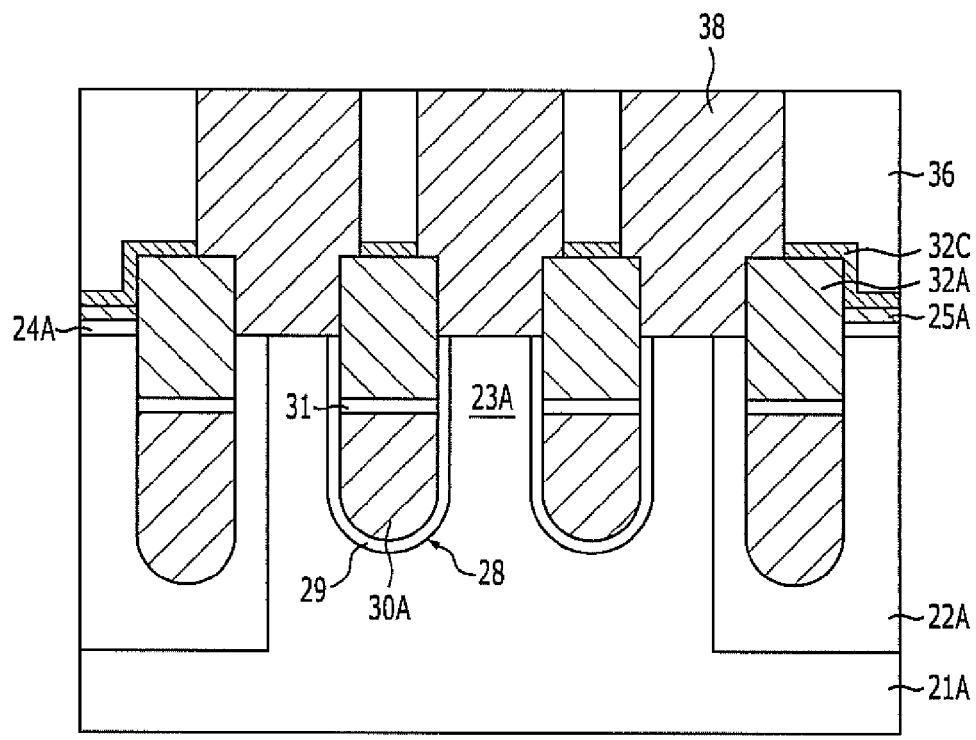

Referring to FIG. 3D, a contact plug 38 is formed in the contact hole 37. The contact plug 38 may include a metal layer such as a tungsten (W) layer.

As described above, it is possible to reduce a distribution of resistances between the contact plugs 38 by uniformly maintaining a width of a region where the contact hole 37 is formed, and prevent a short between the buried gate 30A and the contact plug 38 from being generated. As a result, a device can be stably formed.

In accordance with the second embodiment of the present invention described above, it is possible to prevent an oxidization of a buried gate by completely sealing an oxygen gas through a double sealing nitride layer structure, and to increase a stability of the device. Further, it is possible to increase a stability of a bridge between contact plugs by preventing loss of sidewalls and corners of a sealing nitride layer during a nitride over-etch of a subsequent contact process.

As described above, an exemplary embodiment of the present invention is directed to forming a sealing nitride layer having a protrusion over a buried gate, or forming a double sealing nitride structure of a first sealing nitride layer having a protrusion and a second sealing nitride layer thereon. As a result, it is possible to increase a device stability by prevent an oxidization of a buried gate by completely sealing an oxygen gas. Further, it is possible to increase a contact margin by making the sealing nitride layer having the protrusion to act as a support for self-alignment during a subsequent contact process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   etching a substrate to form a plurality of trenches;
   forming a plurality of buried gates that fill lower portions of the trenches;
   forming a plurality of sealing layers that gap-fill upper portions of the trenches and have protrusions higher than a top surface of the substrate;
   forming an inter-layer insulation layer over the whole surface of the substrate including the sealing layers; and
   etching the inter-layer insulation layer to form a contact hole that is aligned with a space between the protrusions of the sealing layers.

2. The method of claim 1, wherein forming the contact hole comprises:
   performing an over-etch process to expose the substrate between the protrusions of the sealing layers.

3. The method of claim 1, further comprising:
   forming a passivation layer over each buried gate before forming the plurality of sealing layers.

4. The method of claim 3, wherein the passivation layer is formed by selectively oxidizing a top surface of each buried gate.

5. The method of claim 1, wherein each sealing layer comprises a nitride layer.

6. A method for fabricating a semiconductor device, comprising:
   etching a substrate to form a plurality of trenches;
   forming a plurality of buried gates that fill lower portions of the trenches;
   forming a plurality of first sealing layers that gap-fill upper portions of the trenches and have protrusions higher than a top surface of the substrate;
   forming a second sealing layer along a profile of the whole surface of the substrate including the first sealing layers;
   forming an inter-layer insulation layer over the second sealing layer; and
   etching the inter-layer insulation layer to form a contact hole that is aligned with a space between the protrusions of the first sealing layers.

7. The method of claim 6, wherein forming the contact hole comprises:
   performing an over-etch process to expose the substrate between the protrusions of the first sealing layers.

8. The method of claim 6, further comprising:
   forming a passivation layer over each buried gate before forming the plurality of first sealing layers.

9. The method of claim 8, wherein the passivation layer is formed by selectively oxidizing a top surface of each buried gate.

10. The method of claim 6, wherein each of the first and second sealing layers comprises a nitride layer.

11. A method for fabricating a semiconductor device, comprising:
    forming a hard mask pattern over a substrate, wherein the hard mask pattern is a stacked layer of first to third hard mask layers;
    forming a plurality of trenches by etching the substrate using the hard mask pattern as an etch barrier;
    forming a plurality of buried gates that fill lower portions of the trenches;
    forming a sealing layer over the whole surface of the substrate to gap-fill upper portions of the trenches;
    forming a plurality of sealing layer patterns that are isolated by etching the sealing layer until the second hard mask layer is exposed;
    forming a plurality of protrusions of the sealing layer patterns by removing the second hard mask layer;
    forming an inter-layer insulation layer over the whole surface of the substrate including the sealing layer patterns; and
    etching the inter-layer insulation layer to form a contact hole that is aligned with a space between the protrusions of the sealing layer patterns.

12. The method of claim 11, wherein forming the contact hole comprises:
    performing an over-etch process to expose the substrate between the protrusions of the sealing layer patterns.

13. The method of claim 11, further comprising:
    forming a passivation layer over each buried gate before forming the sealing layer.

14. The method of claim 13, wherein the passivation layer is formed by selectively oxidizing a top surface of each buried gate.

15. The method of claim 11, wherein the sealing layer comprises a nitride layer.

16. The method of claim 11, wherein the second hard mask layer has a thickness greater than the first and third hard mask layers.

17. The method of claim 11, wherein the second hard mask layer is formed of an oxide layer, and the first and third hard mask layers are formed of a nitride layer.

18. The method of claim 11, wherein forming the sealing layer patterns to be isolated is performed by a chemical mechanical polishing (CMP) process to polish the sealing layer until the second hard mask layer is exposed.

19. A method for fabricating a semiconductor device, comprising:
    forming a hard mask pattern over a substrate, wherein the hard mask pattern is a stacked layer of first to third hard mask layers;
    forming a plurality of trenches by etching the substrate using the hard mask pattern as an etch barrier;
    forming a plurality of buried gates that fill lower portions of the trenches;
    forming a first sealing layer over the whole surface of the substrate to gap-fill upper portions of the trenches;
    forming a plurality of first sealing layer patterns that are isolated by etching the first sealing layer until the second hard mask layer is exposed;
    forming a plurality of protrusions of the first sealing layer patterns by removing the second hard mask layer;
    forming a second sealing layer along with a profile of the whole surface of the substrate including the first sealing layer patterns;
    forming an inter-layer insulation layer over the second sealing layer; and
    etching the inter-layer insulation layer to form a contact hole that is aligned with a space between the protrusions of the first sealing layer patterns.

20. The method of claim 19, wherein forming the contact hole comprises:

performing an over-etch process to expose the substrate between the protrusions of the first sealing layer patterns.

21. The method of claim 19, further comprising:
forming a passivation layer over each buried gate before forming the first sealing layer.

22. The method of claim 21, wherein the passivation layer is formed by selectively oxidizing a top surface of each buried gate.

23. The method of claim 19, wherein each of the first and second sealing layers comprises a nitride layer.

24. The method of claim 19, wherein the second hard mask layer has a thickness greater than the first and third hard mask layers.

25. The method of claim 19, wherein the second hard mask layer comprises an oxide layer, and the first and third hard mask layers comprise a nitride layer.

26. The method of claim 19, wherein forming the first sealing layer patterns that are isolated is performed by a chemical mechanical polishing (CMP) process to polish the first sealing layer until the second hard mask layer is exposed.

* * * * *